United States Patent [19]
Nishizawa et al.

[11] 3,986,060
[45] Oct. 12, 1976

[54] COMPOUND TRANSISTOR CIRCUITRY

[75] Inventors: Jun-ichi Nishizawa, Sendai; Yasunori Mochida, Hamamatsu, both of Japan

[73] Assignee: Nippon Gakki Seizo Kabushiki Kaisha, Hamamatsu, Japan

[22] Filed: June 10, 1975

[21] Appl. No.: 585,713

[30] Foreign Application Priority Data
June 11, 1974 Japan.............................. 49-66925

[52] U.S. Cl.......................... 307/304; 307/202 R; 307/237; 330/35; 330/207 P
[51] Int. Cl.²....................... H03F 3/16; H02H 9/00
[58] Field of Search ........... 307/304, 251, 237, 202; 330/35, 94, 207 P

[56] References Cited
UNITED STATES PATENTS
3,407,360  10/1968  Buhr................................. 330/94 X OTHER PUBLICATIONS
"Cascode Field Effect Transistor Applications"; Amelco Semiconductor; Division of Teledyne, Inc., Tech. Notes No. 5; pp. 1-14, 10/1963.
Ott, "Biasing the Junction FET", EEE; Jan. 1970; pp. 52-57.
Sherwin et al., EEE (pub.); Oct. 1967; pp.82-85.

Primary Examiner—John S. Heyman
Assistant Examiner—Larry N. Anagnos
Attorney, Agent, or Firm—Cushman, Darby & Cushman

[57] ABSTRACT

A compound transistor circuitry comprises a non-saturation type first field effect transistor and a saturation type second field effect transistor which is direct-coupled to the source circuit of said first FET. The internal dynamic resistance of the second FET functions as a negative feed-back element for the first FET. This internal dynamic resistance will greatly increase when the drain current of the second FET saturates. As a result, the compound transistor circuitry presents an output characteristic closely resembling that of the first FET within the operative range where the second FET does not saturate, whereas the circuitry presents an output characteristic that the current saturates at a level substantially equal to the saturating current of the second FET within the operative range where the second FET saturates.

11 Claims, 10 Drawing Figures

COMPOUND TRANSISTOR CIRCUITRY

BACKGROUND OF THE INVENTION a. Field of the Invention

The present invention is concerned with a compound transistor circuitry which is a combination of a non-saturation type field effect transistor, and a saturation type field effect transistor or a bipolar transistor, with or without a reactance element.

b. Description of the Prior Art

A field effect transistor (hereinafter to be referred to briefly as FET) of the prior art has a characteristic resembling that of a pentode vacuum tube, and presents a saturation phenomenon in its drain current-drain voltage characteristic. Although this known FET is different from known bipolar transistors in that the former is of the voltage-controlled type whereas the latter is of the current-controlled type, the known FET has characteristics which are very closely similar to the characteristics of the bipolar transistor. Accordingly, said known FET (which will hereinafter to be referred to simply as the saturation type FET) is used under the operation conditions which are substantially similar to those for the pentode vacuum tube or the bipolar transistor. In other words, the saturation type FET is, usually, operated in the range where its drain current is saturated. In this range, this saturation type FET exhibits a very large internal dynamic resistance.

Recently, however, there has been proposed and placed in the market a non-saturation type FET having non-saturation characteristics closely resembling those of a triode vacuum tube, unlike the saturation type FET. As an example of this non-saturation type FET, there is a vertical type junction FET.

This non-saturation type FET does not develop saturation phenomenon in its drain current-drain voltage characteristic, but presents a very low internal dynamic resistance which is comparable with the triode vacuum tube throughout the entire range of operation. Accordingly, this non-saturation type FET is quite suitable for driving a load of a low impedance. Also, because of its low internal dynamic resistance, this type of FET is hardly affected by its internal electrostatic capacity and by the stray capacity. Thus, this non-saturation type FET is advantageous in carrying out an amplification of a high frequency signal.

This non-saturation type FET, however, having on the one hand the aforesaid advantages has on the other hand a shortcoming that, in case this FET is over-driven, its drain current will exceed the allowable value and accordingly it is then easily damaged. For example, in the event that the pulsive noise signal of a large amplitude is applied to the gate electrode of this FET in operation, there will flow a pulsive current of a very large amplitude through the drain electrode. And, accordingly, the peak value of this current will exceed the allowable value of the drain current of this FET, and as a result, the FET itself could be damaged. In this respect, there would be a need for bringing forth some way to prevent the occurrence of such an accident.

Also, in the aforesaid vertical type junction FET, there will flow a very large current through its drain electrode in case its gate circuit is opened. The value of this drain current is determined by the voltage of the power source which is connected between the drain and the source electrodes and by the impedance of a load which is inserted in series in the path of flow of the drain current. Accordingly, in case an amplifier or the like device for driving a low impedance load is constructed by this non-saturation type FET, the drain current will surpass its allowable value at the time the gate circuit is opened and will cause damage to this FET. However, it is not desirable, from the viewpoint of effectively displaying the advantages of the non-saturation type FET, to augment the impedance of the load for the purpose of preventing such a breakage of the FET.

SUMMARY OF THE INVENTION

It is, therefore, a primary object of the present invention to provide a compound transistor circuitry using a non-saturation type FET, which improves the disadvantages of this FET without adversely affecting the advantages.

More specifically, said primary object of the present invention is to provide a circuitry of the type described above which has the characteristic that the drain current of the non-saturation type FET will not saturate until the drain current gains a certain value and that this drain current will saturate in case it exceeds said value.

Another object of the present invention is to provide a compound transistor circuitry of the type described above, of which the value at which the aforesaid drain current begins to saturate can be varied.

Still another object of the present invention is to provide a compound transistor circuitry of the type described above, wherein no saturation of the aforesaid drain current will take place for a drive signal of a required specific frequency.

These as well as other objects and features of the present invention will become apparent by reading the following detailed description of the present invention when taken in conjunction with the accompanying drawings.

DETAILED DESCRIPTION OF THE PREFERRED EMBODIMENTS

Prior to making a description of the present invention, explanation will hereunder be made first on the output characteristics of both the non-saturation type FET and the saturation type FET.

Figure 1:
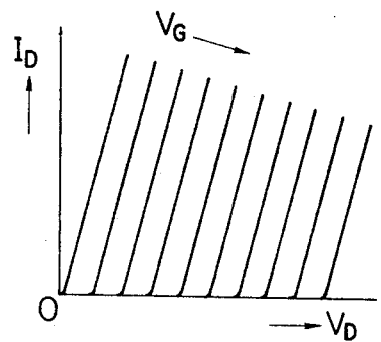
FIG. 1 is a chart showing the output characteristic of a non-saturation type FET.

FIG. 1 shows the output characteristic of a non-saturation type FET, i.e. the drain characteristic (drain current $I_D$ versus drain voltage $V_D$ with gate voltage $V_G$ as a parameter). As will be understood from this drawing, in the non-saturation type FET, the drain current $I_D$ presents non-saturation characteristic relative to the drain voltage $V_D$. The internal dynamic resistance, i.e. the dynamic resistance between the drain and the source electrodes presents a substantially constant small value, for example 10 ohms, throughout the entire range of the drain voltage.

Figure 2:
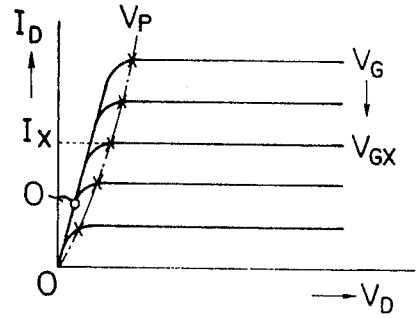
FIG. 2 is a chart showing the output characteristic of a known saturation type FET.

On the other hand, the output characteristic of a known saturation type FET, i.e. the drain characteristic (drain current $I_D$ versus drain voltage $V_D$ with gate voltage $V_G$ as parameter) is as shown in FIG. 2. As will be apparent from FIG. 2, in the known saturation type FET, when the drain voltage $V_D$ is below the pinch-off voltage $V_P$, the drain current $I_D$ will increase in substantially direct proportion to the drain voltage $V_D$. In case, however, the drain voltage $V_D$ exceeds the pinch-off voltage $V_P$, the drain current $I_D$ will suddenly saturate. When the drain voltage $V_D$ is below the pinch-off voltage $V_P$, the internal dynamic resistance, i.e. the dynamic resistance between the drain and the source electrodes, remains at a substantially constant small value, for example 10 ohms. In case, however, the drain voltage $V_D$ exceeds the pinch-off voltage $V_P$, the dynamic resistance will have a very large value, for example 1 meg-ohms.

Since the output characteristic of the bipolar transistor, i.e. the collector characteristic (collector current versus collector voltage with base current as a parameter), also resembles the output characteristic of the saturation type FET, its explanation is omitted.

Next, a description will be made of some examples of the present invention.

Figure 3:
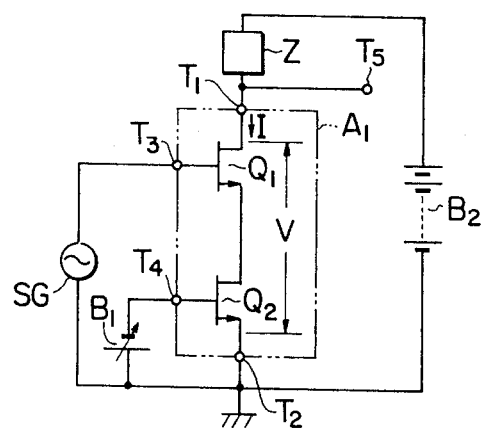
FIG. 3 is an electric circuit diagram of an amplifier circuit showing an example of the compound transistor circuitry according to the present invention.

Referring to FIG. 3, description will be made on the compound transistor circuitry $A_1$ of the present invention as being one applied to an amplifier circuit.

Symbol Q1 represents an n-channel non-saturation type FET, and symbol Q2 represents an n-channel saturation type FET. The drain electrode of the non-saturation type FET Q1 is connected to a first terminal T1, and its source electrode is connected to the drain electrode of the saturation type FET Q2. The source electrode of this saturation type FET Q2 is connected to a second terminal T2. In other words, the saturation type FET Q2 is connected in series to the source circuit of the non-saturation type FET Q1. The gate electrode of this non-saturation type FET Q1 is connected to a third terminal T3 which, together with said second terminal T2, constitutes a drive signal input terminal. The gate electrode of the saturation type FET Q2 is connected to a fourth terminal T4.

A drive signal source SG is connected across said second terminal T2 and said third terminal T3. Whereas, a variable voltage supply source B1 as the gate bias source for the saturation type FET Q2 is connected across the fourth terminal T4 and the second terminal T2. Also, a series circuit composed of a load Z and a drain voltage supply source B2 is connected across the first terminal T1 and the second terminal T2. Symbol T5 represents an output terminal of the amplifier circuit.

Figure 4:
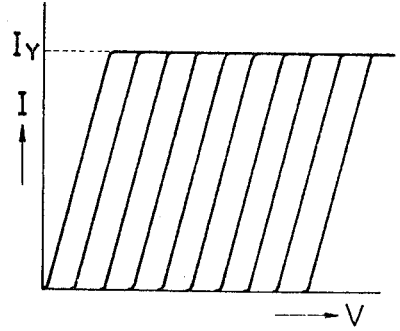
FIG. 4 is a chart showing the output characteristic of the compound transistor circuitry shown in FIG. 3.

The aforesaid compound transistor circuitry $A_1$ has an output characteristic as shown in FIG. 4. More specifically, the current I which flows through the first and the second terminals T1 and T2 will increase in substantially direct proportion to an increase in the voltage V across these terminals T1 and T2, assuming that the potential of the third terminal T3 is constant. This current I, however, will not increase but will saturate when said current gains a certain value $I_y$. This value $I_y$ of the saturating current will be substantially in agreement with the saturation value $I_x$ of the drain current when the gate voltage of the saturation type FET Q2 takes a value $V_{GX}$. Accordingly, the value $I_y$ of the saturating current can be set arbitrarily by adjusting the gate voltage of the FET Q2 through adjustment of the output voltage of the variable voltage supply source B1.

Describing in further detail, it should be noted that, by gradually elevating the potential of the third terminal T3, the current I will increase in substantially direct proportion to said potential of this terminal T3. During this mode of operation, the drain current of the saturation type FET Q2 which is equal to the current I will increase along the curve shown in thick line in FIG. 2. As the current I increases up to a value near the saturating drain current value $I_x$, or in other words, as the drain voltage of the saturation type FET Q2 approaches the pinch-off voltage $V_P$, the internal dynamic resistance of this saturation type FET Q2 will suddenly increase. If the current I makes a still further increase, the drain voltage of the saturation type FET will suddenly elevate. As a result, the gate bias of the non-saturation type FET Q1 will become deeper by an amount corresponding to the component of said increase in the drain voltage of the saturation type FET. Thus, the current I, i.e. the drain current of the FET's Q1 and Q2, will be inhibited of its making any further increase. In other words, as a result of the fact that the voltage drop which develops in the internal dynamic resistance of the saturation type FET Q2 is fed back negatively to the gate electrode of the non-saturation type FET Q1, the current I will saturate at a current value $I_y$ which is substantially equal to the saturating drain current value $I_x$ of the saturation type FET, as shown in FIG. 4.

As stated above, the compound transistor circuitry $A_1$ according to the present invention functions so that the current I which is equal to the drain current of the non-saturation type FET Q1 saturates at a certain current value $I_y$. Therefore, by setting the biasing voltage of the saturation type FET Q2 by adjusting the voltage supply source B1 so that this saturating current value $I_y$ is lower than the maximum allowable value of the drain current of the non-saturation type FET Q1, the non-saturation type FET Q1 will never be damaged due to an over-drive of the FET Q1 even when an excessively large signal is inputted to the third terminal T3. Accordingly, the impedance of the load Z and the voltage of the drain voltage supply source B2 will never have to be limited for the purpose of protection of the FET Q1 against an over-drive operation.

In the range wherein the current I is smaller than the saturating current value $I_y$, the internal dynamic resistance of the saturation type FET Q2 is very small and is substantially constant. Therefore, the dynamic resistance across the first and the second terminals T1 and T2 will become substantially equal to the internal dynamic resistance of the non-saturation type FET Q1, and also the transconductance of the compound transistor circuitry $A_1$ will become substantially equal to the transconductance of the non-saturation type FET Q1 itself.

In case it is intended to faithfully amplify a drive signal of a symmetrical wave such as a sine wave by the use of the amplifying circuitry described above, it is necessary that the operation point of the saturation type FET Q2 at the time when no signal is applied to the third terminal T3 be set at substantially the mid point (for example, point O in FIG. 2) of the non-saturation mode operation range of this saturation type FET Q2. In order to satisfy this condition, a separate bias voltage supply source may be connected to the third terminal T3, if required.

Figure 5:
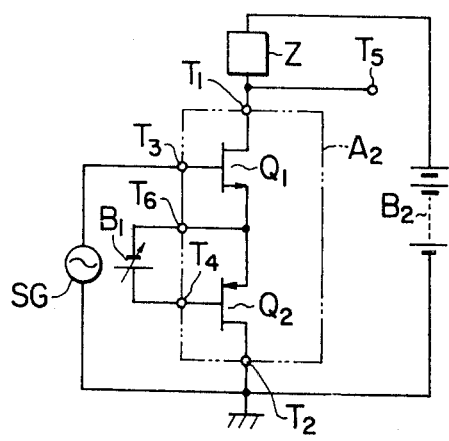
FIG. 5 and FIG. 6 are electric circuit diagrams of amplifier circuits showing modified examples of the compound transistor circuitry according to the present invention.
Figure 6:
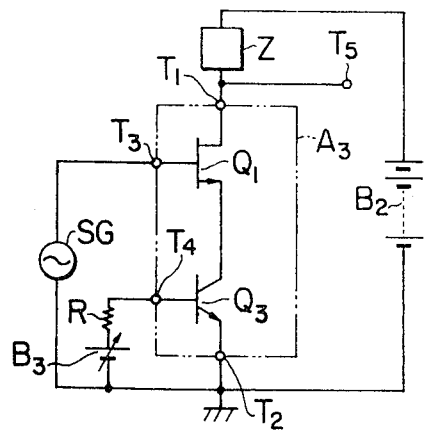

FIGS. 5 and 6 show amplifier circuits, respectively, which are composed of compound transistor circuits $A_2$ and $A_3$ according to the present invention which represents modifications of the aforesaid compound transistor circuitry $A_1$. In the compound transistor circuitry $A_2$ shown in FIG. 5, a p-channel saturation type FET is used as the saturation type FET Q2. Accordingly, the connection of the source and the drain electrodes of this saturation type FET Q2 is the opposite of that of the compound transistor circuitry $A_1$ shown in FIG. 3. In the circuitry shown in FIG. 5, there is provided a sixth terminal T6, and also the variable voltage supply source B1 for applying a gate bias voltage to the saturation type FET Q2 is connected between the fourth terminal T4 and the sixth terminal T6.

Also, the compound transistor circuitry $A_3$ shown in FIG. 6 is arranged so that a bipolar transistor Q3 is used in place of the saturation type FET Q2, and so that the variable voltage supply source B1 of the reverse biasing polarity is replaced by a variable voltage supply source B3 of the normal biasing polarity with a resistor R.

The fact that the functions of these compound transistor circuitries $A_2$ and $A_3$ are silimar to the functions of the aforesaid compound transistor circuitry $A_1$ will be understood easily without requiring any further explanation.

Figure 7:
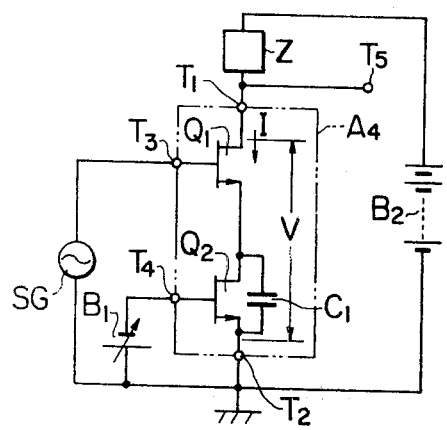
FIG. 7 is an electric circuit diagram of an amplifier circuit showing still another example of the compound transistor circuitry according to the present invention.

FIG. 7 shows an amplifier circuit which is composed of another compound transistor circuitry $A_4$ embodying the present invention. The difference in structure between this compound transistor circuitry $A_4$ and the aforesaid compound transistor circuitry $A_1$ is found in that the former is arranged so that a capacitor C1 is connected across the source and the drain electrodes of the saturation type FET Q2.

Figure 8:
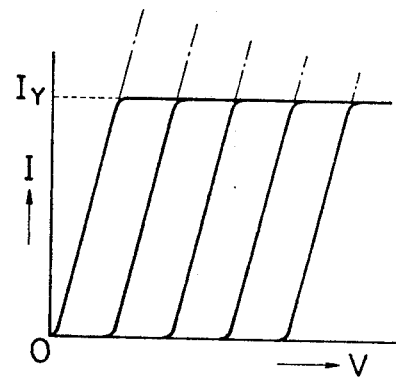
FIG. 8 is a chart showing the output characteristic of the compound transistor circuitry shown in FIG. 7.

This compound transistor circuitry $A_4$ is of an output characteristic as shown in FIG. 8. More specifically, the influence of the capacitor C1 can be disregarded for a drive signal having such a frequency that the impedance of the capacitor C1 will become extremely large compared to the internal dynamic resistance developing at the time of saturation of the saturation type FET Q2. Therefore, the output characteristic of this compound transistor circuitry $A_4$ is perfectly identical with the output characteristic (see FIG. 4) of the compound transistor circuitry $A_1$, and it is shown by the solid line in FIG. 8. For a drive signal having such a frequency that the impedance of the capacitor C1 takes a value sufficiently smaller than the internal dynamic resistance of the saturation type FET Q2 in the saturation mode operation, there is performed no negative feedback action with respect to this saturation type FET Q2. Therefore, the output characteristic of the compound transistor circuitry $A_4$ is as indicated by the dot-and-chain line in FIG. 8, and no saturation phenomenon will take place.

As such, an amplifier circuit which is composed of this compound transistor circuitry $A_4$ has the following advantages that, by appropriately selecting the capacitance of the capacitor C1, an over-drive operation of the amplifier circuit due to an unnecessary low frequency component, such as hum noise, which is present in a drive signal can be avoided, and that the amplifier circuit can perform faithful amplification of the required high frequency component in the drive signal without developing any distortion thereof due to saturation of the whole circuitry.

Figure 9:
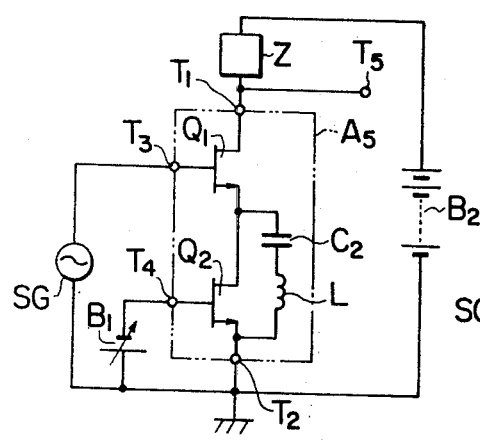
FIG. 9 is an electric circuit diagram of an amplifier circuit showing yet another example of the compound transistor circuitry according to the present invention.

FIG. 9 shows an amplifier circuit which is composed of another compound transistor circuitry $A_5$ embodying the present invention. This compound transistor circuitry $A_5$ is so arranged that a series resonance circuit which is composed of a capacitor C2 and an inductor L is connected between the drain electrode and the source electrode of the saturation type FET Q2. This circuitry exhibits an unsaturated output characteristic as shown by the dot-and-chain line in FIG. 8, for a drive signal having a frequency close to the resonance frequency of said series resonance circuit. For any drive signal having a frequency other than that mentioned above, the circuitry will exhibit a saturated output characteristic as shown by a solid line in FIG. 8. This amplifier circuit also has advantages similar to those of the amplifier circuit shown in FIG. 7.

Figure 10:
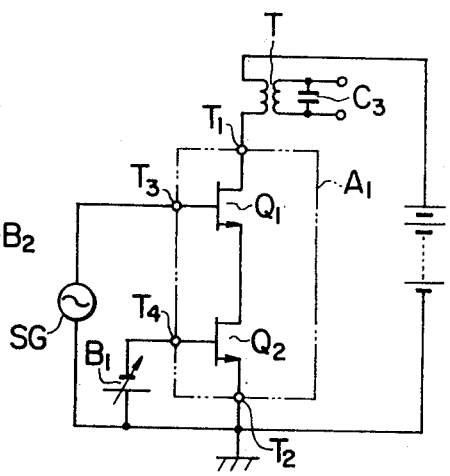
FIG. 10 is an electric circuit diagram showing an amplitude-limiter amplifier circuit which is composed with the compound transistor circuitry shown in FIG. 3.

FIG. 10 shows an amplitude-limiter amplifier circuit utilizing the saturation characteristic of the compound transistor circuitry $A_1$ shown in FIG. 3. In this drawing, symbol T represents a transformer which, together with a capacitor C3, constitutes a tank circuit.

In the above-stated description, the non-saturation type FET Q1 has been mentioned as being of an n-channel type FET. It should be understood, however, that this FET Q1 may be replaced by a p-channel type non-saturation FET. In such an instance, it is needless to say that the drain current supply source B2 should have an inverted polarity, that the saturation type FET Q2 has an opposite conductivity type channel and the bipolar transistor Q3 has an inverted carrier type, and further that the bias voltage supply sources B1 and B3 must have inverted polarities, respectively. Also, the non-saturation type FET Q1 and the saturation type FET Q2 each may have a plural number of parallel connections. For example, the compound transistor circuitry $A_5$ shown in FIG. 9 may have a plural number of saturation type FET's Q2 which are connected in parallel, and by connecting series resonance circuits having different resonance frequencies relative to each other at a site between the source electrodes and the drain electrodes of these respective FET's Q2 there can be materialized a compound transistor circuitry which will exhibit unsaturated output characteristic for a drive signal of a plural number of frequencies.

Furthermore, the non-saturation type FET Q1, the saturation type FET Q2, the bipolar transistor Q3 and moreover, the capacitors C1 and C2 and the inductor L need not be independent parts, but the compound transistor circuits $A_1$, $A_2$, $A_3$, $A_4$ and $A_5$ may be formed into a single integral monolithic solid state circuitry.

We claim:

1. A compound transistor circuit comprising:

a non-saturation type FET having a triode-like non-saturated drain voltage versus drain current characteristic, and a saturation type FET having a pentode-like saturated drain voltage versus drain current characteristic, said non-saturation type FET being connected to said saturation type FET to form a series current path therethrough, a drive signal source being connectible to the gate electrode of said non-saturation type FET, a bias voltage source being connectible to the gate electrode of said saturation type FET, the bias voltage from said bias voltage source establishing a predetermined upper current level of current flow through said compound transistor circuit, the voltage versus current characteristic of said compound transistor circuit corresponding to the drain voltage to drain current characteristic of said non-saturation type FET when the current level therethrough is less than said upper current level, said current flow through said compound transistor circuit being always less than or equal to said upper current level.

2. The compound transistor circuit of claim 1 wherein said non-saturation type FET and said saturation type FET both have a channel of the same conductivity type.

3. The compound transistor circuit according to claim 2 further comprising a capacitor connected in parallel between the source electrode and the drain electrode of said saturation type FET, said capacitor by-passing relatively high frequency signals applied between the source and drain electrode of said saturation type FET.

4. The compound transistor circuit of claim 2 further comprising a series resonance circuit connected in parallel between the source electrode and the drain electrode of said saturation type FET, said series resonance circuit by-passing selected frequency components of signals applied between the source electrode and the drain electrode of said saturation type FET.

5. The compound transistor circuit of claim 1 wherein said non-saturation type FET and said saturation type FET have channels of opposite conductivity types relative to each other.

6. The compound transistor circuit of claim 5 further comprising a capacitor connected in parallel between the source electrode and the drain electrode of said saturation type FET, said capacitor by-passing relatively high frequency components of signals applied between the source and drain electrode of said saturation type FET.

7. The compound transistor circuit of claim 5 further comprising a series resonance circuit connected in parallel between the source electrode and the drain electrode of said saturation type FET, said series resonance circuit by-passing selected frequency components of the signal applied between the source and drain electrode of said saturation type FET.

8. The compound transistor circuit of claim 1 further comprising a capacitor connected in parallel between the source electrode and the drain electrode of said saturation type FET, said capacitor by-passing high frequency signals applied across the source and drain electrode of said saturation type FET.

9. The compound transistor circuit of claim 1 further comprising a series resonance circuit connected in parallel between the source electrode and the drain electrode of said saturation type FET, said series resonance circuit by-passing predetermined frequency components of signals applied between the source electrode and the drain electrode of said saturation type FET.

10. A compound transistor circuit comprising:

a non-saturation type FET having a triode-type non-saturated drain voltage versus drain current characteristic, and a bipolar transistor, said non-saturation type FET being connected in series with said bipolar transistor, a drive signal source being connectible to the gate of said non-saturation type FET, and a bias voltage source being connectible to the base of said bipolar transistor, the gate bias voltage coupled to the base electrode of said bipolar transistor establishing an upper current level, said compound transistor circuit having a voltage versus current characteristic corresponding to the drain voltage versus drain current characteristic of a non-saturation type FET when the current flow through said compound transistor circuit is less than said upper limit, said bipolar transistor limiting the upper level of current flow through said compound transistor circuitry.

11. The compound transistor circuit of claim 10 wherein said non-saturation type FET is an N-channel type FET and said bipolar transistor is an NPN type transistor.

* * * * *